(12) United States Patent
Kudo et al.

(10) Patent No.: US 7,973,419 B2
(45) Date of Patent: Jul. 5, 2011

(54) SEMICONDUCTOR DEVICE AND METHOD OF FABRICATING THE SAME

(75) Inventors: Tomoyasu Kudo, Oita (JP); Kazutaka Ishigo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 991 days.

(21) Appl. No.: 11/582,348

(22) Filed: Oct. 18, 2006

(65) Prior Publication Data

US 2007/0090549 A1 Apr. 26, 2007

(30) Foreign Application Priority Data

Oct. 24, 2005 (JP) ................................ 2005-308624

(51) Int. Cl.
*H01L 23/544* (2006.01)
(52) U.S. Cl. ......... 257/797; 257/E21.525; 257/E23.179; 438/401; 438/462
(58) Field of Classification Search ................ 257/797, 257/E23.179, E21.525; 438/401, 462
See application file for complete search history.

(56) References Cited

U.S. PATENT DOCUMENTS

| | | | | |
|---|---|---|---|---|
| 5,665,645 | A * | 9/1997 | Kinugawa | 438/637 |
| 5,783,490 | A * | 7/1998 | Tseng | 438/692 |
| 5,889,335 | A | 3/1999 | Kuroi et al. | |
| 5,935,764 | A * | 8/1999 | Kakehashi | 430/314 |
| 6,376,924 | B1 | 4/2002 | Tomita et al. | |
| 6,380,049 | B1 * | 4/2002 | Hamada et al. | 438/462 |
| 6,420,791 | B1 * | 7/2002 | Huang et al. | 257/797 |
| 6,737,658 | B1 * | 5/2004 | Nakasugi et al. | 250/492.22 |
| 6,756,691 | B2 | 6/2004 | Tomita et al. | |
| 2001/0035547 | A1 * | 11/2001 | Isogai | 257/296 |
| 2004/0219727 | A1 * | 11/2004 | Kawagoe et al. | 438/197 |
| 2005/0167733 | A1 * | 8/2005 | McGee et al. | 257/316 |

FOREIGN PATENT DOCUMENTS

| | | |
|---|---|---|
| JP | 4-211121 | 8/1992 |
| JP | 7-29854 | 1/1995 |
| JP | 8-316336 | 11/1996 |
| JP | 09-298169 | 11/1997 |
| JP | 2001-36036 | 2/2001 |
| JP | 2001-102278 A | 4/2001 |
| JP | 2001-102440 | 4/2001 |
| JP | 2001-307999 | 11/2001 |
| JP | 2001-308181 A | 11/2001 |
| JP | 2002-110500 | 4/2002 |
| JP | 2003-168687 A | 6/2003 |
| JP | 2004-288798 A | 10/2004 |
| JP | 2007-115797 A | 5/2007 |

OTHER PUBLICATIONS

Quirk et al., Semiconductor Manufacturing Technology, p. 214-215, Prentice-Hall, 2001.*
Notice of Reasons for Rejection issued by the Japanse Patent Office on Nov. 16, 2010, for Japanese Patent Application No. 2005-308624 and an English language translation thereof.

* cited by examiner

*Primary Examiner* — Eugene Lee
*Assistant Examiner* — Peniel M Gumedzoe
(74) *Attorney, Agent, or Firm* — Finnegan, Henderson, Farabow, Garrett & Dunner, L.L.P.

(57) ABSTRACT

According to an aspect of the invention, there is provided a semiconductor device including a semiconductor substrate, a p-type impurity diffusion layer formed on the semiconductor substrate, and Ni silicide formed on the diffusion layer, wherein an alignment mark for lithography is formed on the Ni silicide.

20 Claims, 3 Drawing Sheets

F I G. 1
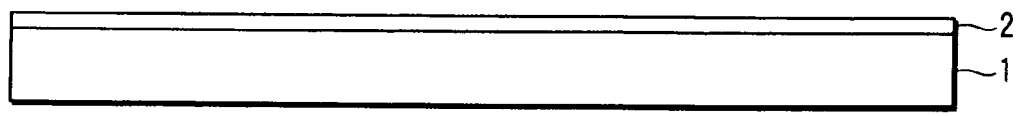
F I G. 2
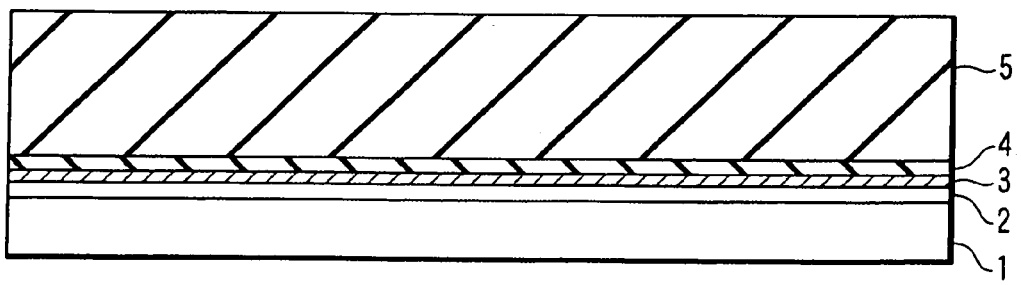
F I G. 3

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2005-308624, filed Oct. 24, 2005, the entire contents of which are incorporated herein by reference.

BACKGROUND OF THE INVENTION

1. Field of the Invention

The present invention relates to a semiconductor device and a method of fabricating the same.

2. Description of the Related Art

Recently, micropatterning of CMOS devices advances scaling in the vertical (height) direction in accordance with that in the horizontal (width) direction. This shallows source/drain regions (deep junctions) and increases the junction leakage. Therefore, Ni silicide which consumes a small amount of silicon must be used in the formation of a silicide.

In the fabrication process of this CMOS device, a metal to be used as an interconnection is finally deposited and patterned by lithography in order to form a metal interconnection. In this lithography, alignment with an underlying pattern is performed using an optical method. This alignment with the underlying pattern uses an alignment mark formed in a region of the underlying pattern.

Unfortunately, Ni silicide is formed in this alignment mark region, and a heating step after the formation of the Ni silicide roughens the surface of the Ni silicide. When the alignment with the underlying pattern is performed using an optical method, this surface roughness acts as noise and significantly decreases the alignment accuracy.

Note that Jpn. Pat. Appln. KOKAI Publication No. 2001-307999 discloses an invention which prevents the formation of a silicide by forming a protective film on an alignment mark. Jpn. Pat. Appln. KOKAI Publication No. 7-29854 discloses an invention which forms an alignment mark by using a contact hole and buries W by forming WSi in only the contact bottom portion. Jpn. Pat. Appln. KOKAI Publication No. 2001-36036 discloses an invention which uses, as an alignment mark structure, a structure obtained by forming a gate electrode in a recess of a substrate and forming polysilicon and a silicide on the gate. Jpn. Pat. Appln. KOKAI Publication No. 2001-102440 discloses an invention which deposits polysilicon and a silicide on a stepped element isolation portion serving as an alignment mark and then removes the polysilicon and silicide. Jpn. Pat. Appln. KOKAI Publication No. 2002-110500 discloses an invention in which an alignment mark made of a silicide defines the relationship between a distance L from the sidewall of an opening to the alignment mark and a thickness H of an insulating film formed on the upper surface of an alignment layer.

BRIEF SUMMARY OF THE INVENTION

According to an aspect of the invention, there is provided a semiconductor device comprising: a semiconductor substrate; a p-type impurity diffusion layer formed on the semiconductor substrate; and Ni silicide formed on the diffusion layer, wherein an alignment mark for lithography is formed on the Ni silicide.

According to another aspect of the invention, there is provided a semiconductor device fabrication method comprising: forming a p-type impurity diffusion layer on a semiconductor substrate; forming Ni silicide on the diffusion layer; and forming an alignment mark for lithography on the Ni silicide.

BRIEF DESCRIPTION OF THE SEVERAL VIEWS OF THE DRAWING

FIG. 1 is a silicon substrate sectional view showing the fabrication procedure of a semiconductor device according to an embodiment of the present invention;

FIG. 2 is a sectional view showing the fabrication procedure of the semiconductor device according to the embodiment of the present invention, in which a p-type impurity is implanted in the substrate shown in FIG. 1;

FIG. 3 is a sectional view showing the fabrication procedure of the semiconductor device according to the embodiment of the present invention, in which Ni silicide, an insulating film, and an interlayer dielectric film are formed on the structure shown in FIG. 2;

DETAILED DESCRIPTION OF THE INVENTION

Figure 4:
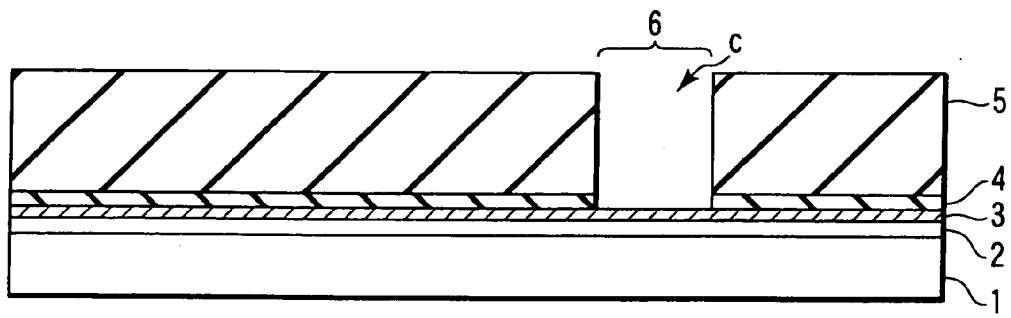
FIG. 4 is a sectional view showing the fabrication procedure of the semiconductor device according to the embodiment of the present invention, in which an alignment mark is formed in the structure shown in FIG. 3.

FIGS. 1 to 7 are sectional views showing the fabrication procedure of a semiconductor device according to an embodiment of the present invention. This fabrication procedure of the semiconductor device according to the embodiment will be explained below with reference to FIGS. 1 to 7. This embodiment forms an alignment mark for an optical contrast alignment method.

First, a p-type impurity is implanted into the surface region of a silicon (Si) substrate 1 as shown in FIG. 1, thereby forming a p$^+$-type diffusion layer 2 as shown in FIG. 2. Note that the p-type impurity includes at least B (boron). The impurity concentration of B is $1\times10^{14}$ cm$^{-2}$ or more. A concentration less than $1\times10^{14}$ cm$^{-2}$ makes the surface roughness suppressing effect unsatisfactory. Then, Ni is deposited on the entire surface by sputtering, and rapid thermal annealing (RTA) for silicidation is performed. This RTA for silicidation is performed at a temperature of, e.g., 350° C. to 500° C. (both inclusive). After that, as shown in FIG. 3, Ni silicide 3 is formed by removing unreacted Ni by a treatment using a solution mixture of sulfuric acid and aqueous hydrogen peroxide.

Note that after Ni is deposited on the entire surface, it is also possible to perform two-step annealing which performs RTA at a low temperature of 250° C. to 400° C. (both inclusive), removes unreacted Ni by a treatment using a solution mixture of sulfuric acid and aqueous hydrogen peroxide, and then performs RTA again at a temperature of 400° C. to 500° C. (both inclusive) in order to decrease the sheet resistance.

After that, an insulating film (silicon nitride) 4 is formed as a stopper for processing on the entire surface. The insulating film 4 is used to prevent removal of the Ni silicide by reactive ion etching (RIE) when a contact hole and an alignment mark for an interconnection are formed later. The insulating film 4 must have high RIE selectivity to an interlayer dielectric film 5 to be deposited later, i.e., an interlayer dielectric film made of, e.g., TEOS, BPSG, or SiN.

Subsequently, the interlayer dielectric film 5 is deposited on the entire surface and planarized by a CMP process. After that, the entire surface is coated with a photoresist, and the photoresist is patterned by photolithography, X-ray lithography, or electron beam lithography to form a resist mask (not shown) having an opening.

Then, as shown in FIG. 4, the interlayer dielectric film 5 and underlying insulating film 4 are selectively etched away by RIE using this resist mask, thereby forming a hole C reaching the surface of the Ni silicide 3. The hole C is formed to serve as an interconnection alignment mark 6. For example, a trench having a short side of 0.2 μm is formed.

Figure 5:
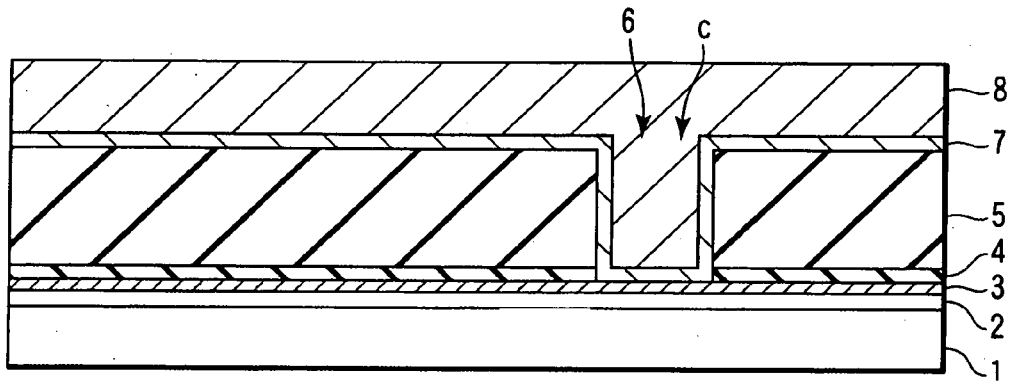
FIG. 5 is a sectional view showing the fabrication procedure of the semiconductor device according to the embodiment of the present invention, in which an electrode is formed in the structure shown in FIG. 4.

After that, as shown in FIG. 5, a barrier metal 7 made of, e.g., titanium or titanium nitride is deposited on the entire surface including the interior of the hole C. Subsequently, tungsten 8 is selectively grown or formed into a blanket to bury a contact plug, and an interconnection alignment mark 6 is formed by the chemical mechanical polishing (CMP) process. Also, a contact (not shown) is formed in the same step as the alignment mark 6. That is, a hole for an alignment mark and contact is formed and filled with an interconnection (or plug) material via a barrier metal or the like, thereby simultaneously forming an alignment mark and contact.

Figure 6:
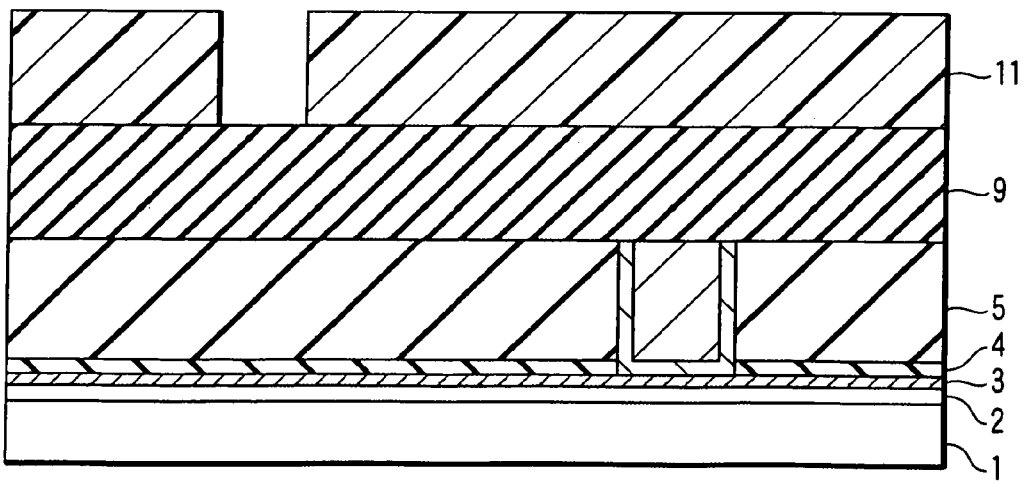
FIG. 6 is a sectional view showing the fabrication procedure of the semiconductor device according to the embodiment of the present invention, in which an insulating film is formed on the structure shown in FIG. 5 and coated with a photoresist.

Then, as shown in FIG. 6, an insulating film 9 is formed on the entire surface. After that, the entire surface is coated with a photoresist 11, and the photoresist 11 is patterned by photolithography, X-ray lithography, or electron beam lithography, thereby forming a resist mask having an opening. Patterning is then performed by lithography to form a metal interconnection. This patterning by lithography is aligned with the interconnection alignment mark 6 formed in the step shown in FIG. 4, in order to align the pattern formed by lithography with the underlying pattern.

Figure 7:
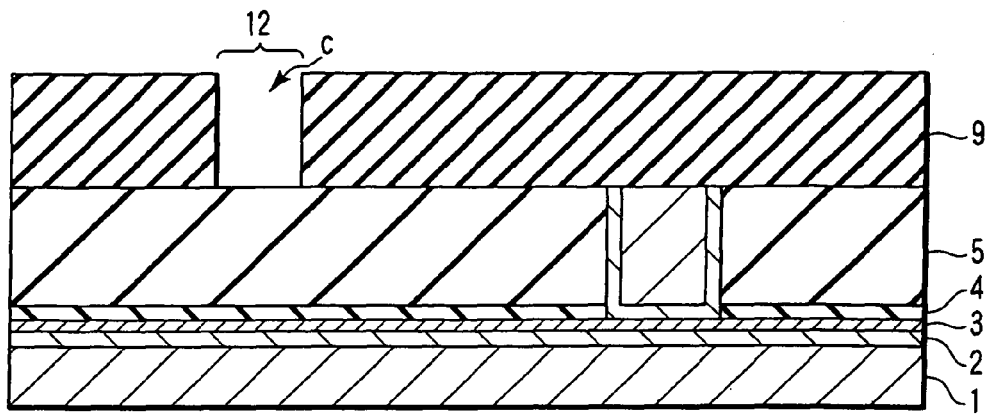
FIG. 7 is a sectional view showing the fabrication procedure of the semiconductor device according to the embodiment of the present invention, in which a metal interconnection pattern is formed in the structure shown in FIG. 6.
Figure 8:
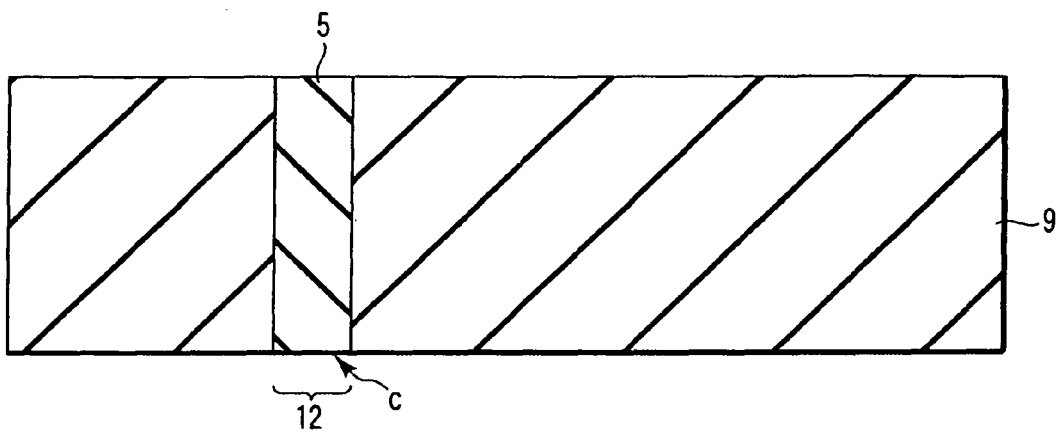
FIG. 8 is a plan view corresponding to FIG. 7 and showing the fabrication procedure of the semiconductor device according to the embodiment of the present invention.
Figure 9:
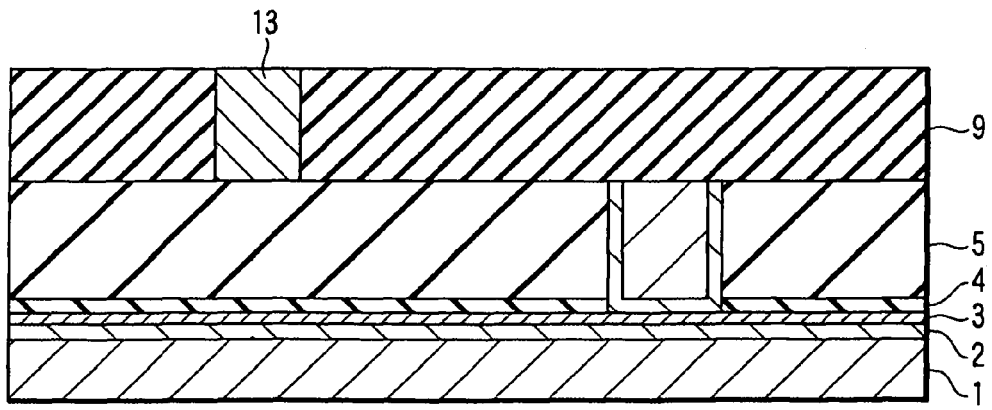
FIG. 9 is a sectional view showing the fabrication procedure of the semiconductor device according to the embodiment of the present invention.

Next, as shown in FIG. 7, the insulating film 9 is selectively etched away by RIE using this resist mask to form a hole C reaching the surface of the interlayer dielectric film 5, thereby forming a metal interconnection pattern 12. Note that FIG. 8 is a plan view of FIG. 7. Finally, as shown in FIG. 9, a metal 13 to be used as an interconnection is deposited.

The conventional method has the problem that when the alignment mark 6 is used in the alignment with the underlying pattern, the heating step after the formation of the Ni silicide roughens the surface of the Ni silicide and significantly decreases the alignment accuracy.

In this embodiment, however, the p$^+$-type diffusion layer 2 formed on the surface of the Si substrate 1 suppresses the Ni silicide surface roughness caused by the heating step after the Ni silicide formation, thereby greatly increasing the alignment accuracy.

As described above, when performing lithography for forming a metal interconnection, this embodiment forms a p$^+$-type diffusion layer by implanting a p-type impurity into an alignment mark region having Ni silicide. Since this suppresses the surface roughness caused by the heating step after the formation of the Ni silicide, it is possible to greatly increase the accuracy of alignment of patterning by lithography with the interconnection alignment mark 6. Also, although the embodiment has described an example in which a conductive material is buried as an alignment mark in a hole, an insulating material different from an interlayer dielectric film in which the hole is formed can also be used.

This embodiment is applicable to devices fabricated using Ni silicide. Examples are memories such as a DRAM, nonvolatile memory, and FeRAM, microcomputers, logic circuits, analog circuits for communication and the like, discrete circuits, optical circuits, and printed circuit boards. Examples of the optical contrast alignment method as an object of this embodiment are AGA (Canon) and FIA (Nikon).

Note that the present invention is not limited to the above embodiment and can be appropriately modified without changing the spirit and scope of the invention. For example, the same effect as in the above embodiment can be obtained without forming the insulating film 4 shown in FIG. 3 and the like. Also, NiPt silicide can be used instead of the Ni silicide 3.

The semiconductor device and the method of fabricating the same according to this embodiment use an alignment mark on Ni silicide formed on a p$^+$-type diffusion layer, thereby suppressing the surface roughness of the Ni silicide and greatly increasing the accuracy of alignment with an underlying pattern during lithography.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a p-type impurity diffusion layer formed on the semiconductor substrate; and
   Ni silicide formed on the p-type impurity diffusion layer, wherein an alignment mark for lithography is formed directly on the Ni silicide, the alignment mark being directly above a region of the p-type impurity diffusion layer and disconnected from an interconnection.

2. The device according to claim 1, wherein the alignment mark comprises a first hole formed in a first insulating layer formed on the Ni silicide.

3. The device according to claim 2, wherein a conductive material is buried in the first hole.

4. The device according to claim 3, which further comprises a second insulating layer which is formed on the first insulating layer and the conductive material, and in which a second hole is formed, and in which a conductive material is buried in the second hole.

5. The device according to claim 2, wherein an insulating material different from an insulating material of the first insulating layer is buried in an entirety of the first hole.

6. The device according to claim 1, wherein an impurity in the diffusion layer includes at least B.

7. The device according to claim 6, wherein an impurity concentration of B is not less than $1 \times 10^{14}$ cm$^{-2}$.

8. The device according to claim 1, wherein the alignment mark is used for an optical contrast alignment method.

9. The device according to claim 2, further comprising a third insulating layer between the Ni silicide layer and the first insulating layer.

10. The device according to claim 9, wherein etching selectivity of the third insulating layer is high with respect to the first insulating layer.

11. A semiconductor device fabrication method comprising:

forming a p-type impurity diffusion layer on a semiconductor substrate;

forming Ni silicide on the p-type impurity diffusion layer; and forming an alignment mark for lithography that is directly above a region of the p-type impurity diffusion layer and disconnected from an interconnection directly on the Ni silicide.

12. The method according to claim 11, wherein an impurity in the diffusion layer includes at least B.

13. The method according to claim 11, wherein the alignment mark is used for an optical contrast alignment method.

14. The method according to claim 11, wherein the formation of the alignment mark comprises:

forming a first insulating layer on the Ni silicide; and forming a first hole in the first insulating layer.

15. The method according to claim 14, wherein a conductive material is buried in the first hole.

16. The method according to claim 15, further comprising:

forming a second insulating layer on the first insulating layer and the conductive material;

forming a second hole in the second insulating layer by lithography using the alignment mark; and burying a conductive material in the second hole.

17. The device according to claim 1, wherein an entirety of the alignment mark is above the region of the p-type impurity diffusion layer.

18. The device according to claim 1, wherein a part of the alignment mark is above the region of the p-type impurity diffusion layer.

19. The method according to claim 11, wherein an entirety of the alignment mark is above the region of the p-type impurity diffusion layer.

20. The method according to claim 11, wherein a part of the alignment mark is above the region of the p-type impurity diffusion layer.

* * * * *